United States Patent
Shiono et al.

(10) Patent No.: US 6,348,094 B1
(45) Date of Patent: Feb. 19, 2002

(54) SAW OR LSAW DEVICE PIEZOELECTRIC SINGLE CRYSTAL WAFER AND METHOD OF MAKING

(75) Inventors: Yoshiyuki Shiono; Toshihiko Ryuo, both of Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/527,671

(22) Filed: Mar. 17, 2000

(30) Foreign Application Priority Data

Mar. 18, 1999 (JP) ............................ 11-072879

(51) Int. Cl.[7] ............................ C30B 15/14
(52) U.S. Cl. .............. 117/2; 117/3; 117/13; 117/951; 117/952; 423/62; 423/119.5; 423/641
(58) Field of Search ................. 117/2, 3, 952, 117/951, 13; 423/62, 179.5, 641

(56) References Cited

U.S. PATENT DOCUMENTS 4,547,262 A * 10/1985 Spillman et al. ............ 156/656
5,191,624 A * 3/1993 Ito et al. ..................... 385/7
5,446,330 A * 8/1995 Eda et al. ................. 310/313 R
5,521,750 A * 5/1996 Onoe et al. .................. 359/332
5,756,263 A * 5/1998 Gupta et al. ................. 430/317

FOREIGN PATENT DOCUMENTS

JP 54-12587 * 1/1979 ..................... 117/3

OTHER PUBLICATIONS

Kimura et al., Shingaku Giho, US 75–56, 17–23 1975.
T. Kimura et al., J. Appl. Phys. 50(7), 4767–4722 (1979).
SAW Technology 150th Committee of Japan Society for the Promotion of Science Ed., SAW Handbook, 296–302, 1991.
Aikawa et al., Autumn Meeting of the Electronic Information Communication Society, 19, 1994.

* cited by examiner

Primary Examiner—Robert Kunemund
(74) Attorney, Agent, or Firm—Birch, Stewart, Kolasch & Birch, LLP

(57) ABSTRACT

A piezoelectric single crystal wafer for SAW or LSAW devices has an x-ray rocking curve half width of up to 0.06° on the wafer surface on which electrodes are to be formed for transmitting and receiving SAW or LSAW.

7 Claims, 1 Drawing Sheet

SAW OR LSAW DEVICE PIEZOELECTRIC SINGLE CRYSTAL WAFER AND METHOD OF MAKING

This invention relates to a piezoelectric single crystal wafer for surface acoustic wave or leaky surface acoustic wave devices and a method for preparing the same.

BACKGROUND OF THE INVENTION

Surface acoustic wave (SAW) and leaky surface acoustic wave (LSAW) devices are circuit elements adapted to transduce electrical signals into SAW or LSAW for signal processing. They are used in filters, resonators and delay lines. In particular, SAW and LSAW devices enjoy a dramatically increasing demand as filters for the current widely spreading mobile communication. Among various wafers used therefor, lithium tantalate single crystal wafers are most often utilized because of their good balance of characteristics. There is an increasing demand for further improvements in quality, especially in the uniformity of SAW and LSAW velocities on the wafer surface and between wafers.

SAW and LSAW devices are generally fabricated by growing a piezoelectric single crystal by a suitable single crystal growth method, for example, growing a lithium tantalate single crystal by the Czochralski method. The single crystal is worked into a cylindrical rod and sliced into a wafer having a desired crystal face orientation. A surface of the wafer on which electrodes are to be formed for transmitting and receiving SAW or LSAW (this surface is herein referred to as wafer surface) is polished to a mirror finish. Electrodes composed primarily of aluminum are formed on the wafer surface in a predetermined orientation. Finally the wafer is cut into chips.

The performance of SAW and LSAW devices depends on the material used, crystallographic orientation, electrode design, fabrication technique and various other factors. One important performance factor associated with SAW and LSAW devices is a work-affected surface layer extending from the surface to a depth of about several tens of microns. The relationship of SAW to the work-affected surface layer and the method of polishing SAW single crystal wafer while taking into account the work-affected surface layer are reported in the following articles.

Kimura et al., Shingaku Giho, US75–56, 17–23, 1975, after making a survey on the relationship of a work-affected surface layer and the Q value of SAW using quartz, report that the presence of a noticeable work-affected layer such as secondary cracks to a depth of half wavelength reveals as a difference of Q value.

T. Kimura et al., J. Appl. Phys., 50 (7), 4767–4772 (1979), after making a survey and analysis on the relationship of a work-affected surface layer and a propagation loss of SAW using quartz, report the relationship of the depth and quantity of microcracks to the propagation loss.

As to the method of polishing a lithium tantalate single crystal wafer for SAW, like the method used for the working of silicon single crystal wafers, a method involving lapping and polishing with a colloidal silica polishing fluid is known (SAW Technology 150th Committee of Japan Society for the Promotion of Science Ed., SAW Handbook, 296–298, 1991). What is required in the polishing step is to establish a mirror finish and to completely remove a strain layer resulting from the lapping step. It is described that since lapping usually uses abrasive grains of less than 15 $\mu$m and thus produces a strain layer of less than 10 $\mu$m thick, polishing to a depth of 10 $\mu$m at most is sufficient.

With respect to the relationship of a work-affected surface layer to LSAW and the method of polishing a single crystal wafer for LSAW, no reports are known.

Further, the SAW velocity and its uniformity have been discussed in connection with the composition and the cutting and propagating directions of a wafer. See SAW Technology 150th Committee of Japan Society for the Promotion of Science Ed., SAW Handbook, 289–302, 1991, and Aikawa et al., Autumn Meeting of the Electronic Information Communication Society, 19, 1994.

However, engineers are now concerned with deviations of SAW and LSAW velocities within wafer surface and between wafers, which are believed to be not accounted for merely by the composition and the cutting and propagating directions. It is strongly desired to analyze the cause of such deviations and find a solution.

SUMMARY OF THE INVENTION

An object of the invention is to provide a novel and improved piezoelectric single crystal wafer for SAW or LSAW devices, having a significantly reduced percentage of rejects caused by a deviation of SAW or LSAW velocity. Another object of the invention is to provide a method for preparing the piezoelectric single crystal wafer.

We made a survey on the relationship of a work-affected surface layer to a deviation of SAW or LSAW velocity. One of the reasons why we paid attention to this relationship is that the relationship of a work-affected surface layer to the Q value and propagation loss of SAW had been reported, but not the relationship of a work-affected surface layer to a deviation of SAW or LSAW velocity. As another reason, it is believed that a work-affected surface layer other than secondary cracks must be considered before the current quality requirement can be fulfilled. Although the current quality requirement apparently differs from the past quality requirement, the point of view and the processing method remain unchanged from the past technology. Finding a solution in this regard is a challenge. We speculated that the state in proximity to the surface where the energy of SAW or LSAW concentrates, that is, the state of a work-affected surface layer is predominant. The term "work-affected surface layer" is a surface layer having strain induced by working as well as secondary cracks. Continuing the research, we have found that the half width of an x-ray rocking curve is useful for evaluating a work-affected surface layer. At the initial stage of our research, the work-affected surface layer was evaluated in terms of etching. There was found no evidence that the etching pattern is correlated to a deviation of SAW or LSAW velocity. Then we supposed that the x-ray rocking curve is effective as a method for evaluating the state of a work-affected surface layer. As a result, we have found that the half width of an x-ray rocking curve is correlated to a deviation of SAW or LSAW velocity. We have also found that heat treatment is effective for improving a deviation of SAW or LSAW velocity. The present invention is predicated on these findings.

Accordingly, in a first aspect, the invention provides a piezoelectric single crystal wafer for SAW or LSAW devices, having an x-ray rocking curve half width of up to 0.06° on the wafer surface on which electrodes are to be formed for transmitting and receiving SAW or LSAW. The piezoelectric single crystal wafer is typically a lithium tantalate single crystal wafer.

In a second aspect, the invention provides a method for preparing a piezoelectric single crystal wafer for SAW or LSAW devices, comprising the steps of polishing a surface of a piezoelectric single crystal wafer and heat treating the wafer such that the wafer has an x-ray rocking curve half width of up to 0.06° on the wafer surface.

According to the invention wherein the half width of an x-ray rocking curve on the wafer surface on which electrodes are to be formed for transmitting and receiving SAW or LSAW is set at or below 0.06°, frequency variations during device manufacture can be minimized. According to the method of the invention wherein polishing is followed by heat treatment, there can be obtained a SAW or LSAW device piezoelectric single crystal wafer having a minimized deviation of SAW or LSAW velocity within the wafer surface and between discrete wafers. The percentage of rejects caused by a deviation of SAW or LSAW velocity during device manufacture is significantly reduced.

DESCRIPTION OF THE PREFERRED EMBODIMENTS

Figure 1:
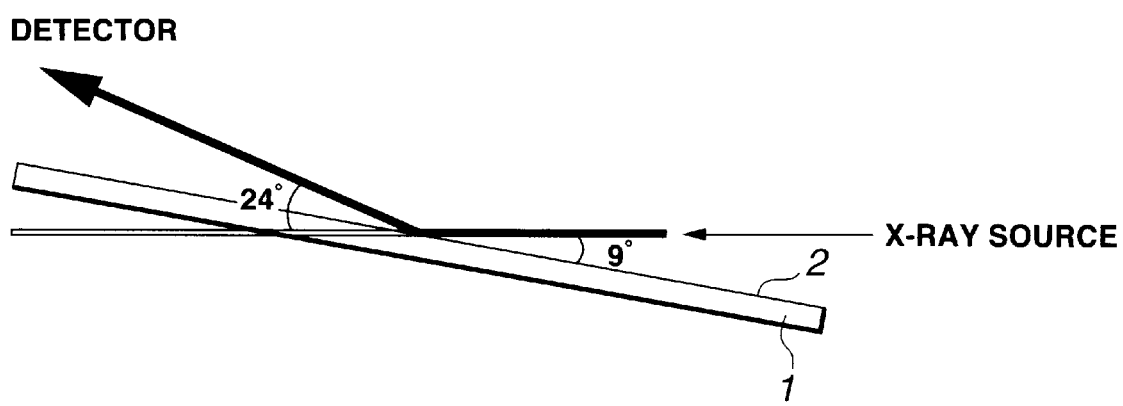
FIG. 1 illustrates an arrangement for measuring an x-ray rocking curve on a 36° Y-cut lithium tantalate single crystal wafer.

The piezoelectric single crystal wafer for SAW or LSAW devices according to the invention has an x-ray rocking curve half width of up to 0.06°, preferably up to 0.05°, and more preferably up to 0.045° on the wafer surface. This setting is effective for minimizing a deviation of SAW or LSAW velocity within the wafer surface and between discrete wafers.

The single crystal wafer used herein may be selected from well-known piezoelectric single crystal wafers commonly used in SAW and LSAW devices, for example, lithium tantalate, lithium niobate, quartz, lithium tetraborate, and langasite. Of these, a lithium tantalate single crystal wafer is preferred. As the piezoelectric single crystal wafer for LSAW devices, a lithium tantalate single crystal wafer in which the direction perpendicular to the wafer surface has an angle in the range of 33° to 46° about X axis in a direction from Y axis to Z axis is preferred.

The single crystal wafer having an x-ray rocking curve half width of up to 0.06° on the wafer surface is prepared from a single crystal grown by an appropriate single crystal growth method, typically the Czochralski method, and having piezoelectricity although lithium tantalate is most preferred as mentioned above. The single crystal, optionally after single-domain treatment, is worked into a cylindrical rod and sliced into a wafer having a desired crystal face orientation. The wafer is optionally lapped on opposed surfaces in a conventional manner, then polished on the wafer surface, and heat treated. The heat treatment following the polishing step ensures that a piezoelectric single crystal wafer for SAW or LSAW devices has a minimized deviation of SAW or LSAW velocity within the wafer surface and between discrete wafers.

The polishing step may be carried out by a conventional technique using a colloidal silica ($SiO_2$) polishing fluid or the like.

The heat treatment can be carried out at a temperature of 400 to 1,600° C., especially 700 to 1,600° C. The heat treating time may be properly selected although it is usually about 1 to 5 hours, especially about 2 to 4 hours. The atmosphere used for heat treatment is typically air, oxygen or nitrogen.

If desired, single-domain treatment is effected subsequent to the heat treatment.

On the wafer after the heat treatment, electrodes of aluminum or the like are formed in a predetermined orientation by a conventional technique. Then the wafer is cut into chips. In this way, SAW or LSAW devices are manufactured.

EXAMPLE

Examples of the invention are given below by way of illustration and not by way of limitation.

Examples & Comparative Examples

Preparation of wafers

A lithium tantalate single crystal having a diameter of 80 mm and a length of 100 mm was grown by the Czochralski method of pulling in a direction rotated about X axis an angle of 36° from Y axis toward Z axis (referred to as 36° Y, hereinafter). The single crystal was subjected to single-domain treatment, worked into a cylindrical rod having a diameter of 76.2 mm, then sliced into wafers such that the wafer surface was perpendicular to the 36° Y direction, using a multi-wire saw. Then each wafer was lapped on opposed surfaces with SiC abrasive grains having a mean particle size of 12 $\mu$m. The surface of the wafer on which electrodes for transmitting and receiving LSAW were to be formed was polished 10 $\mu$m to a mirror finish using a colloidal silica polishing fluid COMPOL-50 (Fujimi Inc.). The polished tantalum lithium single crystal wafer had a diameter of 76.2 mm and a thickness of 0.4 mm.

Heat treatment of wafers

The wafers were heat treated in air under the conditions shown in Table 1 as procedures A to E. In procedures D and E, heat treatment was followed by single-domain treatment again. It is noted that the wafer melted if the temperature was higher than in procedure E.

Measurement of x-ray rocking curve

The wafers heat treated under the conditions shown in Table 1 were analyzed by x-ray diffractometry, from which the half width of an x-ray rocking curve was determined. Using an x-ray diffractometer with an x-ray source Cu$k\alpha$, x-ray rocking curves of 012 reflection based on the hexagonal system were measured at five random points within the wafer surface. Half widths at the five points were determined, an average of which was the x-ray rocking curve half width.

Figure 2:
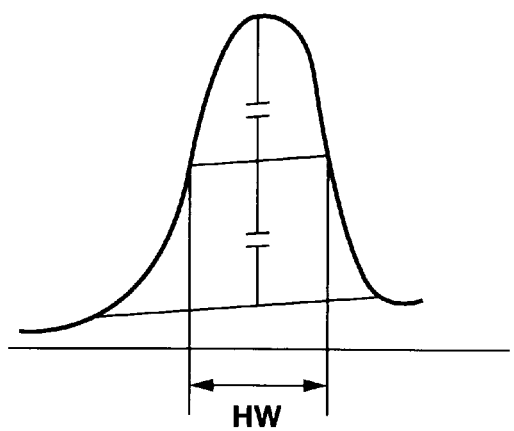
FIG. 2 illustrates the half width of an x-ray rocking curve.

The arrangement for this measurement is shown in FIG. 1 in which a wafer 1 has a wafer surface 2. When an x-ray is incident on the wafer surface 2 at an angle of 9° relative to the wafer surface, an x-ray radiating therefrom at an angle of 24° was detected by a detector. It is noted that the top of the figure (sheet of paper) corresponds to the X-axis direction of the hexagonal system. As shown in FIG. 2, the half width of a rocking curve is the width HW of a peak at a point corresponding to one half of the maximum intensity of the peak.

Measurement of LSAW velocity

On the wafer surface for which the x-ray rocking curve half width was measured, an aluminum film was deposited and interdigital electrodes were formed therefrom by photolithography. In this way, 100 one-port resonators were fabricated from one wafer. The LSAW velocity and the frequency have the following relation:

$$v = f \cdot \lambda$$

wherein v is a LSAW velocity (m/s), f is a frequency (MHz), and $\lambda$ is a wavelength ($\mu$m).

In an experiment with the electrode periodicity set to λ/4=1 μm, the frequency was measured by a network analyzer, from which the LSAW velocity was determined. A deviation of LSAW velocity is the difference between the maximum and the minimum of 100 LSAW velocity data thus obtained. The results are shown in Table 1.

TABLE 1

| Proce-dure | Heat treatment | X-ray rocking curve half value (°) | Deviation of LSAW velocity (m/s) | |
|---|---|---|---|---|
| A | none | 0.081 | 4.1 | Comparison |
| B | 300° C./2 hr | 0.079 | 3.9 | Comparison |
| C | 400° C./2 hr | 0.060 | 2.0 | Invention |
| D | 700° C./2 hr | 0.058 | 1.9 | Invention |
| E | 1600° C./2 hr | 0.057 | 1.8 | Invention |

While the foregoing examples used 36° Y-cut lithium tantalate single crystal wafer for LSAW, similar results were obtained with X-cut lithium tantalate for SAW. Similar results were also obtained with lithium niobate, quartz, lithium tetraborate and langasite.

There has been described a piezoelectric single crystal wafer wherein the half width of an x-ray rocking curve on the wafer surface on which electrodes for transmitting and receiving SAW or LSAW are to be formed is set at or below 0.06°, whereby frequency variations during device manufacture are minimized. According to the method of the invention involving polishing followed by heat treatment, there can be obtained a SAW or LSAW device piezoelectric single crystal wafer having a minimized deviation of SAW or LSAW velocity within the wafer surface and between discrete wafers. The percentage of rejects caused by a deviation of SAW or LSAW velocity during device manufacture is reduced.

Japanese Patent Application No. 11-072879 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A piezoelectric single crystal wafer for SAW or LSAW devices, having an x-ray rocking curve half width of up to 0.06° on the wafer surface on which electrodes are to be formed for transmitting and receiving SAW or LSAW, wherein said x-ray rocking curve half width of up to 0.06° is imparted by heat treatment at a temperature of 400 to 1,600° C. for a period of about 1 to 5 hours.

2. The piezoelectric single crystal wafer of claim 1, which is a lithium tantalite single crystal wafer.

3. The piezoelectric single crystal wafer of claim 1, wherein the wafer for LSAW devices is a lithium tantalite single crystal wafer in which the direction perpendicular to the wafer surface has an angle in the range of 33 to 46° about X axis in a direction from Y axis to Z axis.

4. A method for preparing a piezoelectric single crystal wafer for SAW or LSAW devices, comprising the steps of polishing a surface of a piezoelectric single crystal wafer and heat treating the wafer at a temperature of 400 to 1,600° C. for a period of about 1 to 5 hours such that the wafer has an x-ray rocking curve half width of up to 0.06° on the wafer surface.

5. The method of claim 4, wherein the heat treatment is effected at a temperature of 700 to 1,600° C.

6. The method of claim 4, wherein the piezoelectric single crystal wafer is a lithium tantalite single crystal wafer.

7. The piezoelectric single crystal wafer of claim 1, wherein the heat treatment is effected at a temperature of 700 to 1,600° C.

* * * * *